United States Patent
Tran et al.

[11] Patent Number: 6,072,676
[45] Date of Patent: Jun. 6, 2000

[54] PROTECTION CIRCUIT FOR AN EXCITATION CURRENT SOURCE

[75] Inventors: Chan Tran, Malden; Steven Martin, Lowell; A. Paul Brokaw, Burlington, all of Mass.

[73] Assignee: Analog Devices, Inc., Norwood, Mass.

[21] Appl. No.: 09/059,145

[22] Filed: Apr. 13, 1998

[51] Int. Cl.[7] ................................ H02H 3/24; H02H 9/00
[52] U.S. Cl. ........................... 361/56; 361/90; 323/284
[58] Field of Search ............................ 361/56, 111, 117, 361/118, 119, 18, 90; 330/9, 277, 279, 59, 122, 123, 311, 307, 291, 282, 253, 254, 261, 288, 255; 323/312, 280, 284, 285; 327/310, 312, 307, 318, 362, 541, 546

[56] References Cited

U.S. PATENT DOCUMENTS

| 3,673,508 | 6/1972 | Callahan, Jr. | 330/257 |
| 4,511,857 | 4/1985 | Gunderson | 330/311 |
| 4,967,103 | 10/1990 | Dikken et al. | 326/34 |
| 5,359,296 | 10/1994 | Brooks et al. | 330/288 |
| 5,525,934 | 6/1996 | Chiu et al. | 327/318 |
| 5,648,739 | 7/1997 | Walther et al. | 327/330 |
| 5,675,341 | 10/1997 | Vallancourt et al. | 341/158 |
| 5,764,464 | 6/1998 | Botker et al. | 361/56 |

*Primary Examiner*—Ronald W. Leja
*Attorney, Agent, or Firm*—Hale and Dorr LLP

[57] ABSTRACT

A protection circuit for an excitation current source protects against excessive compliance voltage by using a cascode transistor between the current source and an output terminal, and a transistor coupled to the output terminal and to the control lead of the cascode transistor to cause the cascode transistor to turn off if the voltage exceeds a threshold level.

17 Claims, 3 Drawing Sheets

6,072,676

PROTECTION CIRCUIT FOR AN EXCITATION CURRENT SOURCE

BACKGROUND OF THE INVENTION

This invention relates to a protection circuit for a current source, and particularly to a protection circuit that allows the compliance voltage of a current source to be greater than a positive power supply or more negative than a negative power supply without damaging the current source.

In circuits that have an excitation current source for providing a current to some other device, the current source has an output voltage compliance, which is the voltage limit that the current source can provide. If the compliance is exceeded, the excitation current source circuitry can be damaged. A manufacturer of a device with such a current source may specify that a user not connect to the current source a device that produces a voltage outside of the compliance range.

SUMMARY OF THE INVENTION

It is an object of the present invention to provide a circuit that protects a current source at voltages outside the compliance range.

A protection circuit for a current source has a first transistor coupled between the current source and a load, and a second transistor for enabling or disabling the first transistor. The first transistor has a first side coupled to a current source and a second side coupled to an input/output (I/O) terminal. The second transistor has a control terminal, a first side coupled to the I/O terminal, and a second side coupled to a control terminal of the first transistor. The second transistor has a control lead coupled to a voltage source. When the voltage at the I/O terminal is sufficiently greater than the voltage of the voltage source, the second transistor turns the first transistor off, thereby protecting the current source from an overvoltage at the I/O terminal. The overvoltage should be considered in terms of absolute value, so an overvoltage can be greater than a positive level or less than a negative level.

In preferred embodiments, the current source is a bipolar transistor, the first transistor is a compound MOS cascode transistor, and the second transistor is an MOS transistor with the same polarity as the transistors in the compound cascode transistor. The compound transistor has two transistors with substrates coupled together and to the substrate of the second transistor. One of the two transistors performs the cascode function, while the other serves as a switch that controls the cascode transistor. The excitation source is preferably connected to an output lead or pin of an integrated circuit. In one embodiment, the excitation source is part of an analog-to-digital converter (ADC) for connection to a detector, such as a resistive temperature detector (RTD) that receives a current and provides a voltage based on its resistance.

The present invention also includes a method implemented by a circuit including driving a current source to produce an excitation current through a cascode transistor to an I/O terminal for a connection to a load if the voltage at the I/O terminal is in the compliance range, and if the voltage at the I/O terminals is outside the compliance range, causing the cascode transistor to turn off so that whatever is coupled to the I/O terminal does not provide current back to the current source.

The present invention provides protection for a current source against excessive voltage by turning off a transistor between the current source and load. With the present invention, while recommendations can be made to a user, the circuitry is protected even if the compliance is exceed. The protection circuit of the present invention can be fabricated with modest die area in a single diffusion region and thus is practical for implementation. Other features and advantages will become apparent from the following detailed description, the claims, and the drawings.

DETAILED DESCRIPTION

Figure 1:
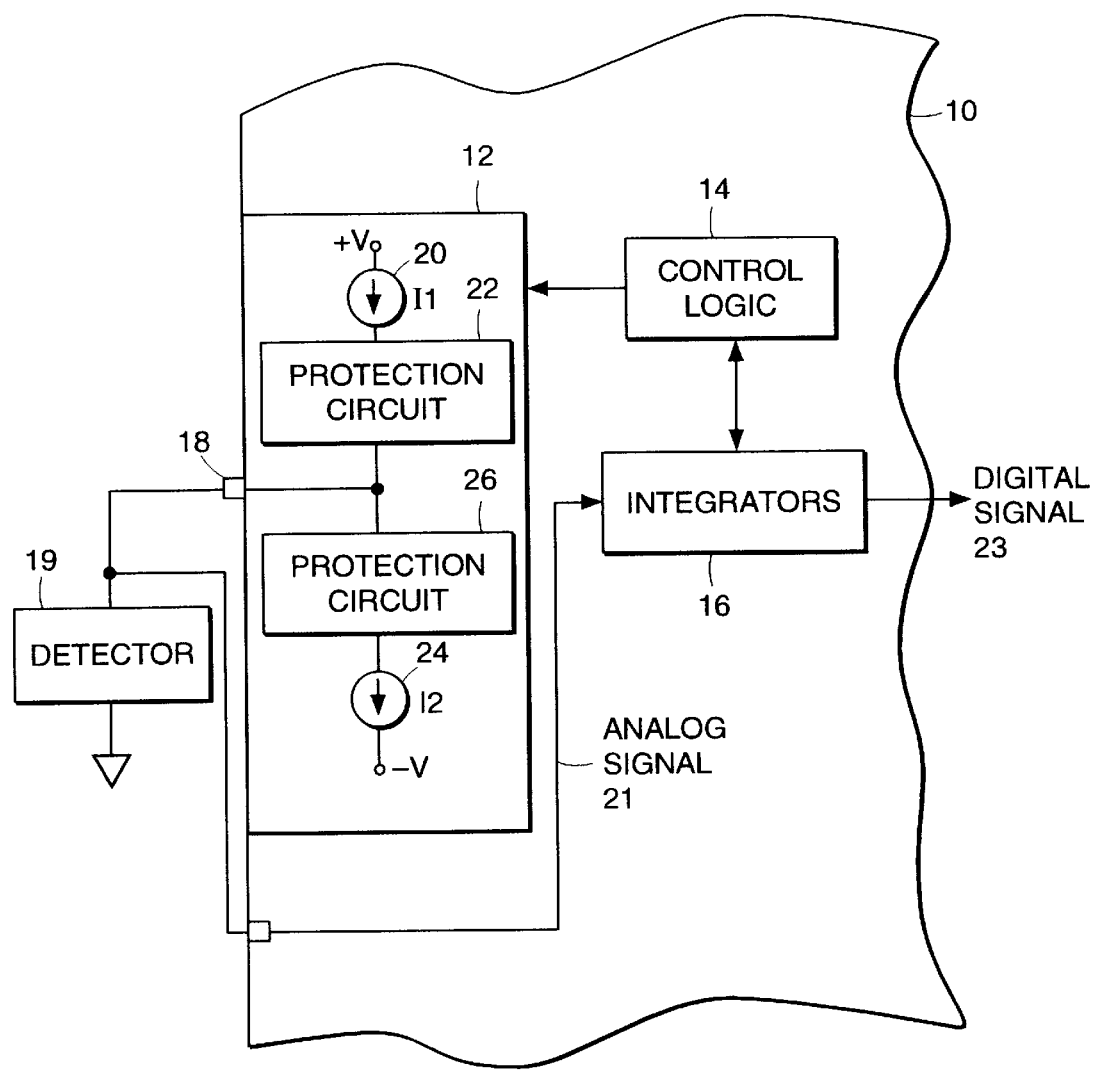
FIG. 1 is a block diagram illustrating an implementation of the protection circuit of the present invention.

Referring to FIG. 1, the present invention is described in connection with an industrial signal conditioning analog-to-digital converter (ADC), although the protection circuit of the present invention is not necessarily limited to use with such a device. FIG. 1 illustrates part of such an ADC 10, including an excitation current source 12, control logic 14, and an integrator 16 for performing the analog-to-digital conversion. These components are all formed on one chip. The control logic is programmable through data pins (not shown) for controlling excitation current source 12 and the integrator 16, e.g., by setting the level of the current provided by the excitation current source. The ADC thus provides an excitation current to an off-chip detector 19, receives an analog signal 21 from the detector 19, and digitizes the analog signal in integrator 16 to provide a digital output signal 23. For example, detector 19 may have temperature-dependent resistance, in which case analog signal 21 represents the voltage across that resistor. Several portions of the ADC circuitry are shown in FIG. 1, but the ADC can include other circuitry, including a crystal oscillator, a charge pump, and a programmable gain amplifier (PGA).

Excitation current source 12 is coupled to an output pin 18 for sourcing or sinking current to or from an off-chip detector. Source 12 has a current source 20 coupled between a positive voltage supply (+V) and a first protection circuit 22, and a second current source 24 coupled between a negative voltage supply (-V) and a second protection circuit 26. Protection circuits 22 and 26 are each coupled to output pin 18.

Figure 2:
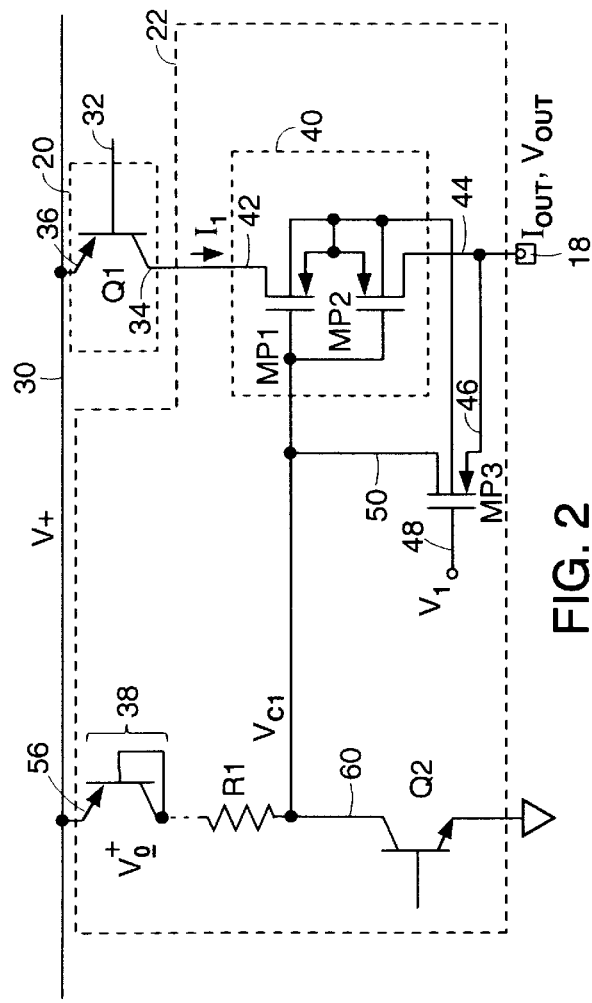
FIGS. 2 and 4 are circuit schematics of the protection circuits of FIG. 1.

FIG. 2 shows current source 20 and protection circuit 22 in more detail. Current source 20 is implemented as a pnp transistor Q1 that has an emitter terminal 36 coupled to a V+ supply rail 30, a base terminal 32 for receiving an input voltage as part of a current mirror (not shown) to control the level of the excitation current, and a collector terminal 34 coupled to protection circuit 22.

Protection circuit 22 has a compound pmos cascode transistor 40 with transistors MP1 and MP2, a transistor MP3, one or more diode connected transistors 38, a resistor R1, and an npn transistor Q2. Compound pmos cascode transistor 40 is made up of two transistors MP1 and MP2 that have their substrates and sources all connected together. The gates of transistors MP1 and MP2 are coupled together and have a voltage $V_{c1}$. A drain terminal 42 of transistor MP1 is coupled to collector terminal 34 of transistor Q1, and a drain terminal 44 of transistor MP2 is coupled to output pin 18 (the sources and drains can be made symmetrical and thus are interchangeable). Transistor MP3 has its substrate connected to the substrate of transistors MP1 and MP2, a source terminal 46 coupled to output pin 18, a gate terminal 48 coupled to receive an input voltage $V_1$, and a drain terminal 50 coupled to the gates of transistors MP1 and MP2 at voltage $V_{c1}$. Voltages $V_1$ and $V_{c1}$ are set to be close enough so that transistor MP3 is off under normal conditions (not an overvoltage at output pin 18).

Voltage $V_{c1}$ is set by diode connected transistors 38, resistor R1, and transistor Q2. Transistors 38 are pnp transistors and each have a voltage drop of $V_D$, typically about 0.6 volts each. The first of transistors 38 has an emitter terminal 56 coupled to supply rail 30 and a collector and base coupled together and connected either to resistor R1 or to an emitter terminal of a next transistor. The last of the series of transistors 38 has a collector and base coupled to a first lead of resistor R1. A second lead of resistor R1 is coupled to a collector terminal 60 of transistor Q2. The voltage at the base of transistor Q2 is provided by a current mirror (not shown) to set a current that is determined in conjunction with the number of diode connected transistors so that the voltage $V_c$ at the collector of transistor Q2 is fixed with respect to V+ so the source voltage of MP2 is basically unaffected by changes in $V_{out}$ and V+. The emitter of transistor Q2 is grounded.

In operation, the significant relationship is that between $V_{out}$ and $V_1+V_{th3}$ ($V_{th3}$ is the threshold voltage of transistor MP3). As long as $V_{out}<V_1+V_{th3}$, current is provided from transistor Q1 through compound transistor 40 to output pin 18. If $V_{out}>V_1+V_{th3}$, however, transistor MP3 turns on. This shuts off transistor 40 by connecting the gate and source of MP2. Assuming that $V_{th3}$ is known to be about 0.8–0.9 v, appropriate application of voltage $V_1$ determines the upper range of the voltage of $V_{out}$ at which current is provided through pin 18. Accordingly, if there is an overvoltage at pin 18, turning off transistor 40 protects transistor Q1 by preventing current from the I/O terminal from damaging the excitation current source.

An example of an appropriate value for $V_1$ is about 3 V, with V+=5 V, so that the compliance is at approximately 4 V. If a device coupled to pin 18 requires more than 4 V (or even more than the positive power supply V+) the current source is effectively disconnected from the output lead, thereby protecting the current source. This circuit provides protection from overvoltages up to the breakdown voltage of the junctions of the fabrication process.

Looking to the operation of compound transistor 40 in more detail, transistor MP1 acts like a switch while transistor MP2 serves as a cascode. In normal (not overvoltage) operation, transistor MP1 conducts with a small voltage drop. If the voltage on the substrate of transistors MP1 and MP2 is slightly negative, the conduction of transistor MP1 pulls the substrate up. Transistor MP1 pulls up the source of transistor MP2 and thus serves as a switch that turns on transistor MP2. Compound transistor 40 thus conducts the current from transistor Q1, while the collector of transistor Q1 is held at a fixed voltage determined by $V_{c1}$ and the threshold voltage and channel support voltage of transistors MP1 and MP2.

If output pin 18 rises to an overvoltage, i.e., greater than $V_1 + V_{th3}$, transistor MP3 connects pin 18 to $V_{c1}$, and the nodes of all the PMOS transistors rise. As transistor MP3 turns on, $V_{c1}$ is pulled up until transistor MP1 turns off, thereby disconnecting transistor Q1 from pin 18. If pin 18 continues to rise, $V_{c1}$ can rise above V+ and the substrate of MP1, MP2, and MP3 rises with pin 18.

The protection circuit protects the current source, and the use of a cascode transistor, as is well known, fixes the collector voltage of transistor Q1, thereby preventing problems that can arise as a result of the Early effect.

Figure 4:
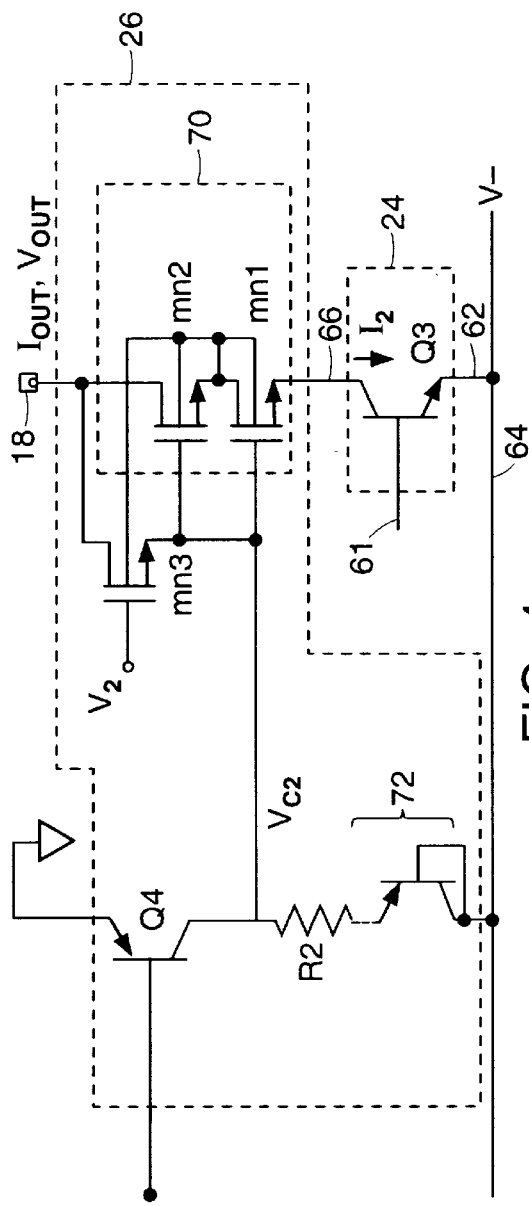

FIG. 4 is a schematic of current source 24 and protection circuit 26 in FIG. 1. Current source 24 is implemented as an npn transistor Q3, with a base terminal 61, an emitter terminal 62 coupled to a negative supply rail (V−) 64 and a collector terminal 66. Base terminal 61 can be controlled to provide a desired current through Q3.

Protection circuit 26 includes compound nmos cascode transistor 70 with transistors MN1 and MN2, a transistor MN3, a pnp transistor Q4, a resistor R2, and one or more pnp diode connected transistors 72. As in the description of the circuit of FIG. 2, the substrates of transistors MN1, MN2, and MN3 are coupled together and coupled to the source of transistor MN2 and the drain of transistor MN1. The gates of transistors MN1 and MN2 are coupled together and to the source of transistor MN3. The drain of transistor MN3 is coupled to the drain of transistor MN2 and to pin 18.

The gates of transistors MN1 and MN2 are at voltage $V_{c2}$. This voltage is set by the voltage drops across pnp diode connected transistors 72 and a resistor R2 on one side and on the other side by transistor Q4 with a grounded emitter, a collector coupled to resistor R2, and a base as part of a current mirror (in a manner similar to that described in conjunction with FIG. 2). Transistor Q4, resistor R2, and the one or more diode connected pnp transistors set voltage $V_{c2}$ relative to voltage V− at supply rail 64 at the common gate of compound transistor 70.

In this circuit, the overvoltage is set by $V_2-V_{th4}$ ($V_{th4}$ is the threshold voltage of transistor MN3). If $V_{out}>V_2-V_{4th}$, MN3 is turned off and current is conducted from pin 18 to negative supply rail 64. In the overvoltage condition with $V_{out}<V_2-V_{th4}$, transistor MN3 turns on and connects the gate and source of transistor MN2 causing it to turn off. Accordingly, by setting voltage $V_2$ as desired, a lower limit on $V_{out}$ can be established while protecting transistor Q3. In one embodiment, $V_2$ is about −4 V, so the overvoltage condition is at approximately −5 V.

Protection circuits 22 and 26 are thus used to protect current sources 20 and 24 from a high or low compliance, respectively, at pin 18, while also providing the benefits of a cascode transistor.

Figure 3:
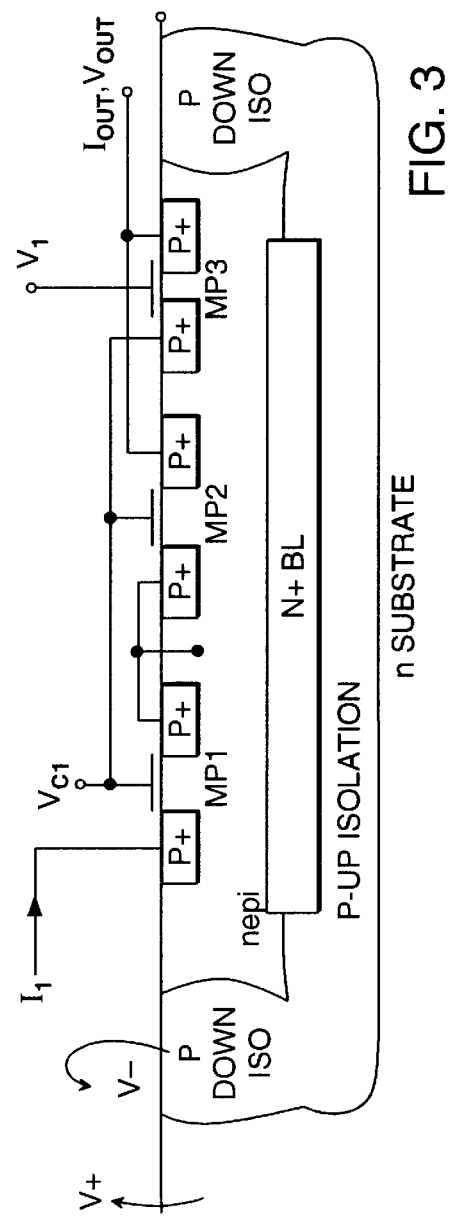
FIGS. 3 and 5 are cross sectional views of part of the circuitry in FIGS. 2 and 4, respectively.
Figure 5:
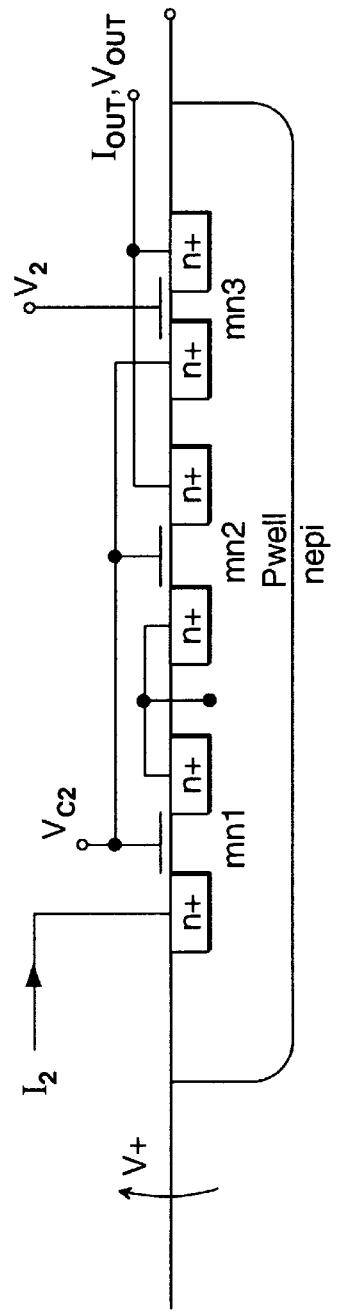

FIGS. 3 and 5 show the implementation of the protection circuits 22 and 26 in a substrate. As shown in FIG. 3, transistors MP1, MP2, and MP3 are each formed side-by-side in an n-type epitaxial layer surrounded by a p-type isolation region. As shown in FIG. 5, transistors MN1, MN2, and MN3 are formed side-by-side in a p-type well in the n-type epitaxial layer. As these figures show, all the MOS transistors can be formed compactly in a single diffusion region.

The current from transistor Q1 can be much greater than the current from transistor Q3, in which case the normal output current is the difference in these two currents. Alternatively, transistor Q1 can be switched off (or not provided), in which case the output current is negative and consists of the current from transistor Q3 only.

Having described a preferred embodiment of the present invention, it should be apparent that modifications can be made without departing from the scope of the invention as defined by the appended claims. For example, while the protection circuitry has been described in connection with an analog-to-digital converter, it could be used with any other circuitry in which it is desirable to protect a current source without relying on a user not to exceed a defined compliance voltage range. While the present invention is described from a circuit with two voltage supplies and protection circuits, if only a single polarity current is needed, one of the current sources and its protection circuit could be omitted. The circuit assumes that the supply voltages have a small range of variability; if V+ or V− were subject to large changes, it would be desirable to provide a cascode transistor for transistor Q2 or Q4, respectively. The output of the excitation current source is described as a pin for a circuit formed on a chip for connection to an external detector, but the output can be a node or terminal generally e.g., if the current source and a detector were formed on a single chip.

What is claimed is:

1. A circuit comprising:
   an input/output (I/O) terminal;
   a first current source having a first side coupled to a first supply rail and a second side;
   a first transistor having a control lead, a first side coupled to the second side of the first current source, and a second side coupled to the I/O terminal;
   a second transistor having a control lead, a first side coupled to the I/O terminal, and a second side coupled to the control lead of the first transistor;
   the transistors being biased so that current flows between the first current source and the I/O terminal if the voltage at the I/O terminal has a first relationship to a threshold voltage level, and if the voltage at the I/O terminal has a second relationship to the threshold voltage level, the second transistor is turned on thereby causing the first transistor to be turned off.

2. The circuit of claim 1, wherein the first supply rail has a positive voltage, and wherein the first transistor is turned off if the voltage at the I/O terminal exceeds the threshold voltage level.

3. The circuit of claim 1, wherein the first supply rail has a negative voltage, and wherein the first transistor is turned off if the voltage at the I/O terminal is less than the threshold voltage level.

4. The circuit of claim 1, wherein the first current source includes a bipolar transistor.

5. The circuit of claim 1, wherein the first transistor is a compound cascode transistor including at least two transistors.

6. The circuit of claim 5, wherein the compound cascode transistor has two MOS transistors.

7. The circuit of claim 6, wherein the two MOS transistors have substrates coupled together and to a substrate of the second transistor.

8. The circuit of claim 7, wherein the transistors of the compound cascode transistor and the second transistor are formed in a single diffusion region.

9. The circuit of claim 1, wherein the circuit is integrated on one chip and the I/O terminal is an output pin of the chip.

10. The circuit of claim 1, further comprising:
    a second current source having a first side coupled to a second supply rail and a second side;
    a third transistor having a control lead, a first side coupled to the second side of the second current source;
    a fourth transistor having a control lead, a first side coupled in the I/O terminal, and a second side coupled to the control lead of the third transistor;
    wherein the first supply rail is a positive supply and the second supply rail is a negative;
    wherein the second transistor causing the first transistor to turn off in case of a positive overvoltage at the I/O terminal, the fourth transistor causing the third transistor to turn off in case of a negative overvoltage.

11. An analog-to-digital converter (ADC) system comprising:
    an excitation current source;
    an analog-to-digital converter (ADC);
    control logic coupled to the excitation current source and the analog-to-digital converter;
    wherein the excitation current source includes the circuit of claim 1.

12. The ADC system of claim 11, wherein the current source, ADC, and control logic are integrated together on one chip.

13. The ADC system of claim 12, wherein the first and second transistors of the excitation current source are integrated in one diffusion region.

14. A circuit-implemented method comprising:
    driving a current source to produce an excitation current through a cascode transistor to an input/output (I/O) terminal for connection to a load if the voltage at the I/O terminal is on one side of a threshold voltage level; and
    wherein the voltage at the I/O terminal is on the other side of the threshold voltage level, causing the cascode transistor to turn off so that the excitation current source does not provide current to the I/O terminal.

15. The method of claim 14, further comprising providing the excitation current at the I/O terminal to a detecting device.

16. The method of claim 15, further comprising receiving an analog signal from the detecting device and digitizing the analog signal.

17. The method of claim 16, wherein the driving, receiving, and digitizing are performed on one chip, and the detecting device is off-chip.

* * * * *

UNITED STATES PATENT AND TRADEMARK OFFICE
CERTIFICATE OF CORRECTION

PATENT NO : 6,072,676
DATED : June 6, 2000
INVENTOR(S) : Chau Tran, Steven Martin, A. Paul Brokaw It is certified that error appears in the above-identified patent and that said Letters Patent are hereby corrected as shown below:

On the title page, item[75],
    Change Inventor's Name From "Chan Tran"
       To --Chau Tran--.

Signed and Sealed this

Third Day of April, 2001

Attest:

NICHOLAS P. GODICI

*Attesting Officer*     *Acting Director of the United States Patent and Trademark Office*